(12) United States Patent
Hargan (10) Patent No.: US 8,570,860 B2
(45) Date of Patent: Oct. 29, 2013

(54) REDUNDANT SIGNAL TRANSMISSION

(75) Inventor: Ebrahim H Hargan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1114 days.

(21) Appl. No.: 12/327,648

(22) Filed: Dec. 3, 2008

(65) Prior Publication Data

US 2010/0135153 A1 Jun. 3, 2010

(51) Int. Cl.
*H04L 12/26* (2006.01)

(52) U.S. Cl.
USPC .......................................................... 370/228

(58) Field of Classification Search
None
See application file for complete search history.

(56) References Cited

U.S. PATENT DOCUMENTS

| | | | | |
|---|---|---|---|---|
| 5,931,967 A * | 8/1999 | Shimizu et al. | ............... | 714/799 |
| 7,133,358 B2 * | 11/2006 | Kano | ............................ | 370/221 |
| 7,362,697 B2 * | 4/2008 | Becker et al. | .................. | 370/217 |
| 7,813,266 B2 * | 10/2010 | Becker et al. | .................. | 370/217 |
| 7,821,919 B2 * | 10/2010 | Mizutani et al. | ............... | 370/216 |
| 7,852,751 B2 * | 12/2010 | Bryant et al. | ................... | 370/218 |
| 7,974,185 B2 * | 7/2011 | Manral et al. | .................. | 370/223 |
| 8,018,837 B2 * | 9/2011 | Becker et al. | .................. | 370/217 |
| 8,050,174 B2 * | 11/2011 | Becker et al. | .................. | 370/217 |
| 2008/0131122 A1 * | 6/2008 | Reisslein et al. | ................ | 398/59 |

* cited by examiner

*Primary Examiner* — Gregory Sefcheck
(74) *Attorney, Agent, or Firm* — Schwegman, Lundberg & Woessner, P.A.

(57) ABSTRACT

Signal transmission apparatus, systems, and methods are disclosed. In various embodiments, a signal transmission system includes a transmission network having signal paths configured to communicate signals from an input to an output, a first steering network coupled to the input that communicates with the transmission network, and a second steering network coupled to the output that communicates with the transmission network. A steering control network that receives error signals corresponding to an inoperable signal path and that generates steering signals directed to the first steering network and the second steering network is included, so that the steering signals shift signals to an alternate, operable signal path from the inoperable signal path. Additional apparatus, systems, and methods are disclosed.

24 Claims, 4 Drawing Sheets

REDUNDANT SIGNAL TRANSMISSION

BACKGROUND

A continuing demand for more compact electronic devices has contributed to the development of three-dimensional multi-chip packages, such as the system in package (SiP) and the chip-stack multi-chip module. In general terms, the multi chip package may include two or more integrated circuit dice that are vertically stacked, and a signal transmission network that electrically couples the dice within the three-dimensional multi-chip package. Accordingly, the multi-chip package may be configured to perform many functions of an electronic system. The reliability of such configurations may suffer when the signal transmission network fails.

BRIEF DESCRIPTION OF THE DRAWINGS

Various embodiments are described in detail in the discussion below and with reference to the following drawings.

DETAILED DESCRIPTION

Various embodiments include processing systems, semiconductor modules, memory systems and methods. Specific details of several embodiments are set forth in the following description and in FIGS. 1 through 5 to provide an understanding of such embodiments. One of ordinary skill in the art, however, will understand that additional embodiments are possible, and that many embodiments may be practiced without several of the details disclosed in the following description. It is also understood that various embodiments may be implemented within a physical circuit that includes physical components (e.g., "hardware"), or they may be implemented using machine-readable instructions (e.g., "software"), or in some combination of physical components and machine readable instructions (e.g., "firmware").

In general, three-dimensional multi-chip modules, such as system-in package (SiP) and chip stack multi-chip modules include vertical stacks of semiconductor dice that may be internally communicatively coupled by a signal transmission network that extends between the dice in the module. Accordingly, the signal transmission network may include individual conductive elements that form a signal transmission path extending between a driver component and a receiving component. The conductive elements may include conductive wiring that extends between the dice, conductive vias that are integrally formed within the multi-chip module, and other known interconnection means. In any case, during fabrication of the multi-chip module, the signal transmission function of a signal transmission path may become inoperable due to the failure of the driver component and/or a receiver component coupled to a conductive element.

More generally, however, the conductive element may be physically interrupted due to a break, which may occur during fabrication. Accordingly, a break in a conductive element (or any of the previously discussed failures) may render the three-dimensional multi-chip module inoperable. Since the module is a complex assembly that entails a number of separate processing steps, discarding the defective module is costly, and generally increases the per-unit cost of the multi-chip module. The inventor has made the discovery that redundant components may be introduced into the multi-chip module, permitting additional signal transmission paths to be utilized. Consequently, multi-chip modules having one or more signal transmission path defects may still be employed as functional devices when such redundant components are used.

Figure 1:
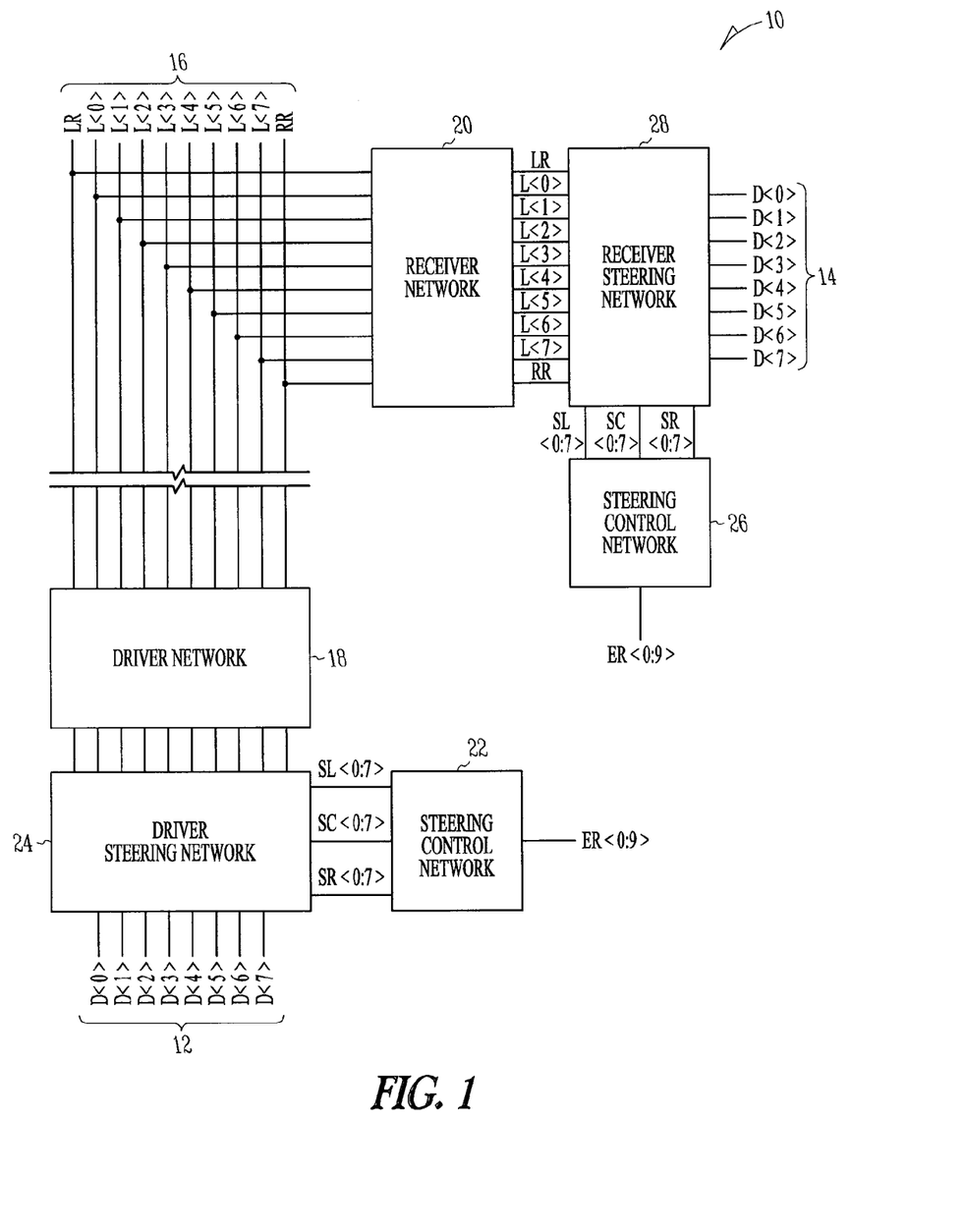
FIG. 1 is a diagrammatic block view of a redundant signal transmission system, according to various embodiments.

FIG. 1 is a diagrammatic block view of a redundant signal transmission system 10, according to one or more of the embodiments. As a preliminary matter, the redundant signal transmission system 10 may be employed in a general or specialized processing system, a memory system, including one or more discrete memory devices, such as a static memory, a dynamic random access memory (DRAM), an extended data out dynamic random access memory (EDO DRAM), a synchronous dynamic random access memory (SDRAM), a double data rate synchronous dynamic random access memory (DDR SDRAM), a double data rate two synchronous dynamic random access memory (DDR2 SDRAM), a double data rate three synchronous dynamic random access memory (DDR3 SDRAM), a synchronous link dynamic random access memory (SLDRAM), a video random access memory (VRAM), a RAMBUS dynamic random access memory (RDRAM), a static random access memory (SRAM), a flash memory, as well as other known memory devices.

The system 10 is configured to communicate a data input 12 that includes data signals D<0> through D<7> to a data output 14. The data signals D<0> through D<7> may be transmitted along a transmission network 16 that includes data lines L<0> through L<7>, and data lines LR and RR. In the various embodiments, the data lines L<0> through L<7>, and data lines LR and RR may comprise metallic wiring extending between dice within a vertically-stacked, multi-chip package. Alternatively, the data lines L<0> through L<7>, and data lines LR and RR may comprise conductive, silicon-based vias that extend at least partially through the vertically-stacked, multi-chip package. The system 10 also includes a driver network 18 that is operable to drive the data signals D<0> through D<7> onto the data lines L<0> through L<7>, LR and RR, and a receiver network 20 that is operable to receive the data signals D<0> through D<7> communicated along the data lines L<0> through L<7>, LR and RR.

The system 10 also includes a steering control network 22 that receives an error signal through an ERR<0:9> signal bus. In general terms, the error signals transmitted along the ERR<0:9> signal bus may be generated by a detection apparatus (not shown in FIG. 1) that is configured to detect a fault in the transmission network 16. For example, in the various embodiments, the detection apparatus may be configured to detect a loss of electrical continuity (e.g., a break) in one or more of the data lines L<0> through L<7>, LR and RR, and generate the corresponding error signal that may be sent along the ERR<0:9> bus. In the various embodiments, the detection apparatus may be configured to detect repeated requests to resend a selected signal, and generate an error signal on the ERR<0:9> bus that reflects an inoperable transmission path when a selected number of requests has been exceeded. In some embodiments, the detection apparatus includes programmable elements that may be set during manufacture, such as anti-fuses, or other similar programmable elements.

As shown in FIG. 1, when a selected one of the bits on the ERR<0:9> bus is low (e.g., the bit on the corresponding line is '0'), the corresponding transmission path is operable. Correspondingly, if a selected one of the bits on the ERR<0:9> bus is high (e.g., the bit on the corresponding line is '1'), the corresponding transmission path is not operable. It is understood, however, that in the various embodiments, opposing logic may be employed, so that if a selected bit on the ERR<0:9> bus is high, the corresponding transmission path is operable, and if the selected bit on the ERR<0:9> bus is low, the corresponding transmission path is inoperable.

The steering control network 22 may be configured to translate the signals on the ERR<0:9> bus to one of several steering buses SL<0:7>, SC<0:7> and SR<0:7>, such that it causes all of the signals to be steered towards the available redundant and away from the inoperable path. Accordingly, the steering control network 22 may be operably implemented using known combinations of logic devices that may be configured to communicate the signals from the ERR<0:9> bus to the steering buses. For example, various known multiplexing circuits, such as, without limitation, 3×1 multiplexer, or other functionally similar devices may be used. The steering buses SL<0:7>, SC<0:7> and SR<0:7> are communicatively coupled to a steering network 24, and are configured to communicate data steering information to the steering network 24. Briefly, and in general terms, the steering bus SL<0:7> may be configured to direct data away from an inoperable data path and onto another data path that is immediately adjacent and to the left of the inoperable data path. It is understood that when the data is directed from the inoperable path and to the data path that is immediately adjacent and to the left of the inoperable path, all other data to the left of the inoperable path is shifted to the left, while data paths to the right of the inoperable path are not shifted. Additionally, the steering bus SR<0:7> may be configured to direct data away from an inoperable data path and onto a data path that is immediately adjacent and to the right of the inoperable data path. Consequently, when the data is directed from the inoperable path and onto the data path that is immediately adjacent and to the right of the inoperable path, all other data to the right of the inoperable path is shifted to the right. Data paths to the left of the inoperable path are not shifted. The steering bus SC<0:7>, in contrast, may permit data to be communicated along an originally intended path (e.g., without rerouting the data signal).

The steering network 24 includes logic elements that are responsive to the signals received from the steering control network 22. Accordingly, when one of the data lines L<0> through L<7>, or an element within the driver network 18 and/or the receiver network 20 are determined to be inoperable, the steering network 24 directs a selected one of the data input 12 signals (e.g., D<0> through D<7>) onto an operative and adjacent one of the data lines L<0> through L<7>, LR, RR. For example, and in accordance with the various embodiments, if the steering network 24 is configured by default to direct data to the left adjacent data line, and if the bit on the ERR<0:9> corresponding to L<0> is high, the data<0> signal is directed to the LR data line, while all other data transmitted on lines to the right of the L<0> line are unaffected (e.g., not shifted). If the bit on the ERR<0:9> corresponding to L<1> is high, the data<1> signal is directed to the L<0> data line, and the data<0> is directed to the LR line. All of the data transmitted on lines to the right of the L<1> are unaffected. Alternatively, if the steering network 24 is configured by default to direct data to the right adjacent data line, and if the bit on the ERR<0:9> corresponding to L<7> is high, the data <7> signal is directed to the RR data line, and all other data transmitted on lines to the left of the L<7> are also shifted. If the bit on the ERR<0:9> corresponding to L<6> is high, the data<6> signal is directed to the L<7> data line, and the data<7> is shifted to the right, and onto RR. The data transmitted on lines to the left of the L<6> is not shifted. It is understood that the steering network 24 may be configured to steer signals by default to the left or to the right. It is also understood that if two of the data lines L<0> through L<7> are defective, either through a physical break in two of the L<0> through L<7> data lines, or due to other defects, then signals may be steered simultaneously to both the left and to the right. In this case, the signals may be directed towards the nearest one of the redundant lines (e.g., LR and RR). For example, if the L<1> and the L<5> lines are determined to be inoperative, data <1> is shifted onto the L<0> line, and the data <0> is shifted onto the LR line. Correspondingly, the data <5> may be shifted to the L<6> line, data <6> may be shifted to the L<7> line, and data <7> may be shifted to RR. Data communicated on other lines (e.g., L<2> through L<4>) is not shifted.

The system 10 may also include a steering control network 26 and a receiver steering network 28. The receiver steering network 28 may be operably coupled to the receiver network 20 and configured to direct signals received from the transmission network 16 (e.g., from the data lines L<0> through L<7>, and the data lines LR and RR) to provide the data output 14. The steering control network 26 is configured to communicate with the ERR<0:9> bus, and to communicate with steering buses SL<0:7>, SC<0:7> and SR<0:7>. Accordingly, if data has been shifted away from an inoperable line by the driver steering network 24, as discussed in detail above, the receiver steering network 28 is configured to shift the data back to the intended data paths. For example, if the system 10 is configured to shift to the left, by default, and if the L<0> line is inoperable, the driver steering network 24 directs D<0> to the line LR. The receiver steering network 28 then directs data on the line LR back onto the intended data path. In the various embodiments, the steering control network 26 may be implemented using various known combinations of logic devices, such as a multiplexer or other functionally similar devices.

Although FIG. 1 shows the steering control network 22, the driver steering network 24 and the driver network 18 as separate elements, it is understood that in various embodiments, the steering control network 22, the driver steering network 24 and the driver network 18 may be incorporated into one or more elements having the previously-described functionality. Correspondingly, the steering control network 26, the receiver steering network 28 and the receiver network 20 may also be incorporated into one or more elements having the previously-described functionality. It is also understood that the signals SL<0:7>, SC<0:7> and SR<0:7> provided by the steering control network 22 and the steering control network 26 may be alternatively provided by a single unit.

Figure 2:
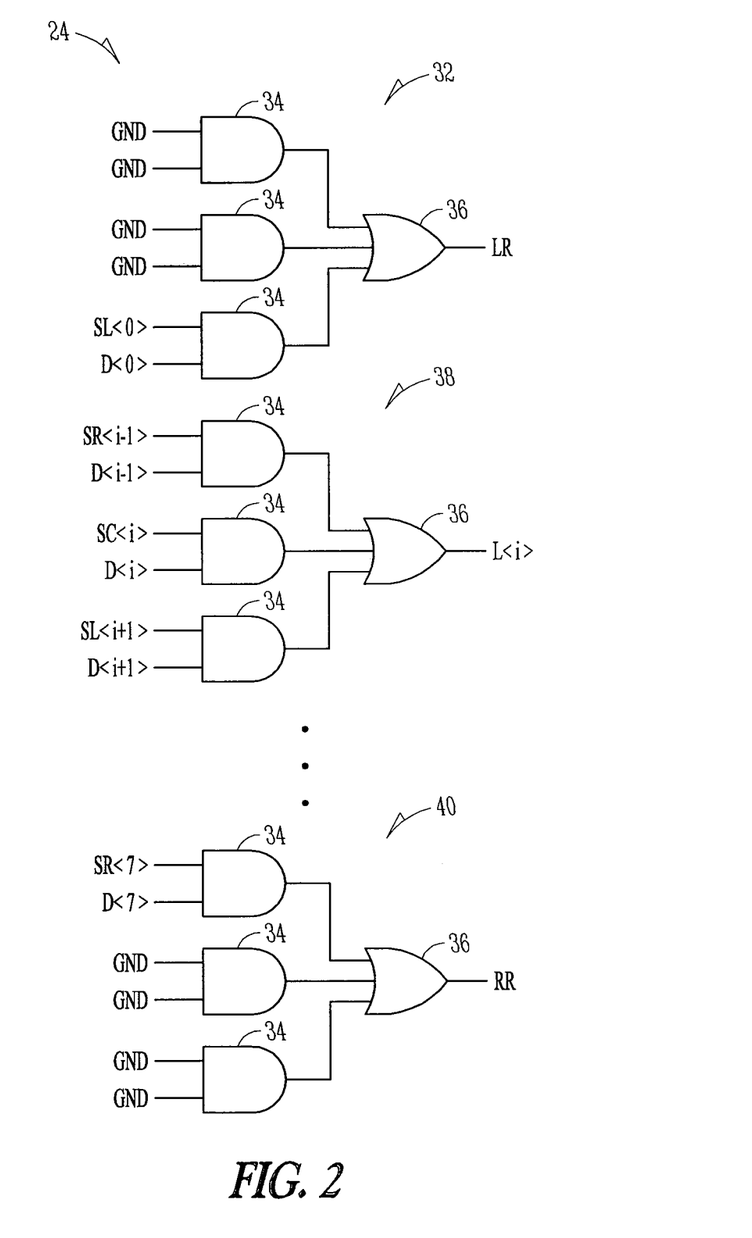
FIG. 2 is a partial schematic view of a driver steering network, according to various embodiments.

With reference now to FIG. 2, the driver steering network 24, according to the various embodiments, will now be described in greater detail. In general, the driver steering network 24 may include a first driver logic unit 32 that is configured to appropriately drive the LR data line. Accordingly, the first driver logic unit 32 may include AND logic gates 34 that are coupled to a three-input OR gate 36. The output of the three-input OR gate 36 is in a logic high state if any one of the inputs (e.g., the outputs from the AND logic gates) is in a logic high state. Inputs to a first selected one of the AND logic gates 34 may be coupled to a ground potential (GND), which may correspond to a logic low state, so that the output of the first selected one of the AND logic gates 34 is a low logic state. Inputs to a second selected one of the AND logic gates 34 may be coupled to GND so that the second selected one of the AND logic gates is also in a logic low state. Inputs to a third selected one of the AND logic gates 34 may be coupled to the signals SL<0> and D<0>. Accordingly, if the SL<0> signal is asserted, the third selected one of the AND logic gates 34 transmits the D<0> logic state, so that the D<0> signal is output to the LR path through the OR gate 36.

The driver steering network 24 may also include intermediate driver logic units 38 that are configured to appropriately drive the intermediate data lines (e.g., the L<0> through L<7> data lines). The intermediate driver logic unit 38 may include AND logic gates 34 and may also include a three-input OR gate 36 that is coupled to the AND logic gates 34. The intermediate driver logic unit 38 may be configured to successively route the data signals D<i> onto the next adjacent data line, if an intended data line is inoperable. For example, if the data line L<1> is inoperable, then the data signal D<1> may be routed to a selected one of the operable adjacent data lines (e.g., to the data line L<0> or to the data line L<2>). In the various embodiments, the driver steering network 24 may be configured in a default-to-the-left configuration, so that if a data line is inoperable, the data line to the immediate left of the inoperable data line is selected. Alternatively, the driver steering network 24 may be configured in a default-to-the-right configuration, so that if a data line is inoperable, the data line to the immediate right of the inoperable data line is selected.

The driver steering network 24 may also include a second driver logic unit 40 that is configured to appropriately drive the RR data line. The second driver logic unit 40 may include AND logic gates 34 and may also include a three-input OR gate 36 that is coupled to the AND logic gates 34. The second driver logic unit 40 may be configured to route the data signal D<7> onto the RR data line, and if the SR<7> signal is asserted, the D<7> data signal is output to the RR path. Accordingly, the first driver logic unit 32, the intermediate driver logic units 38 and the second driver logic unit 40 collectively permit an inoperable data line to be avoided by shifting a selected data signal D<0:7> away from the inoperable line and onto the next immediately adjacent line. Since the affected data signal D<0:7> is routed to the adjacent line, the additional signal path length introduced by the signal rerouting is minimized, so that signal transmission speeds through the redundant signal transmission system 10 are not adversely affected.

While a specific configuration of signals and logic gates has been shown in FIG. 2, it should be noted that other configurations are possible. That is, gates with a different number and type of inputs may be used, and different combinations of signals may be presented to these gates. Any combination of gates and signals that enables steering signals away from inoperable transmission paths can be used in the various embodiments. In the foregoing discussion, it is understood that the first driver logic unit 32 and the second driver logic unit 40 are coupled to respective left and right portions of the transmission network 16 (e.g., LR and RR in FIG. 1, respectively) while intermediate driver logic units 38 are coupled to the intermediate portions of the transmission network 16 (e.g., L<0> through L<7> in FIG. 1).

Figure 3:
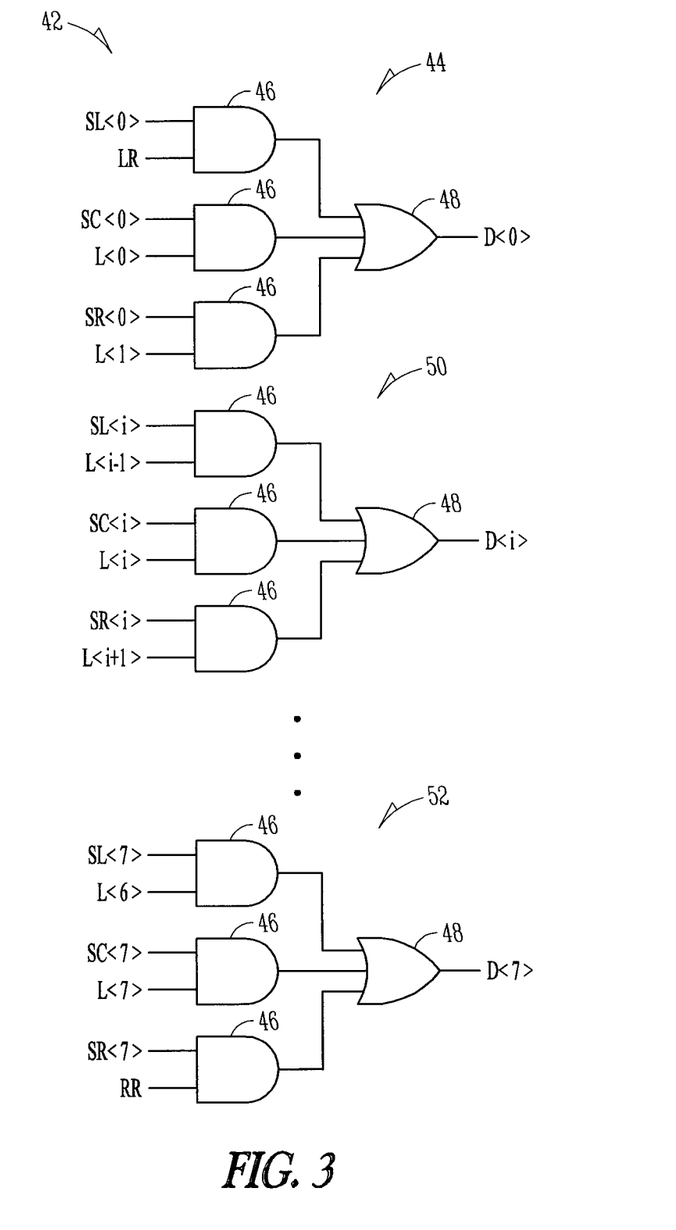
FIG. 3 is a partial schematic view of a receiver steering network, according to various embodiments.

Turning now to FIG. 3, the receiver steering network 42, according to the various embodiments, will now be described in greater detail. The receiver steering network 42 is controllably coupled to the ER<0:9> signal bus through the steering control network 26 (as shown in FIG. 1). Accordingly, and in general terms, the receiver steering network 42 is operable to route all data signals that were redirected by the driver steering network 24 away from an inoperable signal path back to the intended signal paths. The receiver steering network 42 may therefore include a first receiver logic unit 44, an intermediate receiver logic unit 50 and a second receiver logic unit 52, which may further include AND logic gates 46 having outputs that are coupled to three-input OR gates 48.

The first receiver logic unit 44 may be configured to pass the data signal carried on the L<0> data line to the D<0> data line in the data output 14 (FIG. 1) provided that the SC<0> signal is asserted. If the D<0> data has been redirected to the LR data line by the driver steering network 24, then SL<0> is asserted also, and the D<0> data is output from the first receiver logic unit 44. If the D<0> data has been redirected to the L<1> data line, then SR<0> is also asserted, and the D<0> data is output from the first receiver logic unit 44.

The intermediate receiver logic unit 50 may be configured to pass the data signals carried on the L<i> data lines to the D<i> data lines in the data output 14, where L<i> includes the L<1> through L<6> data lines (as shown in FIG. 1). Accordingly, if the SC<i> signal is asserted, the data on the L<i> data line is communicated to the three-input OR gate 48, and output from the intermediate receiver logic unit 50. If the D<i> data has been redirected to the L<i−1> data line, then SL<i> is asserted also, and the D<i> data is output from the first receiver logic unit 50. If the D<i> data has been redirected to the L<i+1> data line, then when SR<i> is also asserted, then the D<i> data is output from the intermediate receiver logic unit 50.

The second receiver logic unit 52 may be configured to pass the data signal carried on the L<7> data line to the D<7> data line in the data output 14 (FIG. 1). Accordingly, when the SC<7> is asserted, the data on the L<7> data line is communicated to the three-input OR gate 48, and output from the second receiver logic unit 52. If the D<7> data has been redirected to the L<6> data line, then SL<7> is asserted also, and the D<7> data is output from the second receiver logic unit 52. If the D<7> data has been redirected to the RR data line, then SR<7> is also asserted, the D<7> data is output from the second receiver logic unit 52.

While a specific configuration of signals and logic gates has been shown in FIG. 3, it should be noted that other configurations are possible. That is, gates with a different number and type of inputs may be used, and different combinations of signals may be presented to these gates. Any combination of gates and signals that enables steering signals toward operative transmission paths can be used in the various embodiments.

Figure 4:
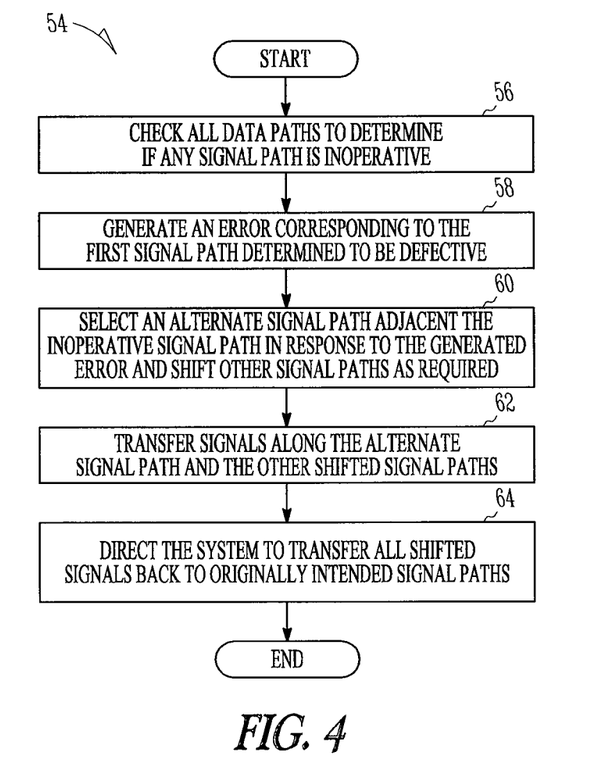
FIG. 4 is a flowchart that describes a method of reconfiguring a signal transmission system, according to various embodiments.

FIG. 4 is a flowchart that will be used to describe a method 54 of configuring a signal transmission system according to the various embodiments. Referring now to FIGS. 1 and 4, it can be seen that at block 56, a check of all signal paths may be made to determine if any signal path is inoperable. For example, the signal path may be inoperable due to a physical interruption (e.g., a 'break') in a line within the transmission network 16. The signal path may also be inoperable due to a failure within one or both of the driver network 18 and the receiver network 20, or within other elements associated with the transmission network 16. In various embodiments, the signal paths may be checked using a diagnostic apparatus and/or software that tests the integrity of the signal paths when energy is applied to a system that includes the data transmission system 16. Alternatively, and in accordance with the various embodiments, the check may be conducted continuously while the system 10 is in operation (e.g., "dynamically"). In still other of the various embodiments, the signal path check may be accomplished by counting resend requests received while sending data on the signal paths, and when a predetermined maximum number of resent requests have been generated, determining that the signal path is inoperable. Alternatively, the check of the signal paths may be conducted during a functional verification test that may occur during production of a device that includes the data transmission system 16. In this case, at least one of the steering control network 22 and the driver steering network 24, and at least one of the steering control network 26 and the receiver steering network 28 may be configured to permanently reconfigure the signal transmission system 16, using antifuses or other similar devices operable to permanently reconfigure circuits, or at least to reconfigure them in a nonvolatile manner.

In any case, at block 58, an error corresponding to the signal path determined to be defective is generated. The error may be transferred to the steering control network 22 coupled to the driver steering network 24, and to the steering control network 26 that is coupled to the receiver steering network 28. The error may be used to permanently program at least one of the steering control network 22 and the driver steering network 24, and at least one of the steering control network 26 and the receiver steering network 28, by programming antifuses in the foregoing networks, as discussed above. Alternatively, the error may be used to reconfigure the signal transmission system, perhaps in a nonvolatile manner, without permanently altering elements within the steering control network 22, the driver steering network 24, the steering control network 26 and the receiver steering network 28.

At block 60, an alternate signal path adjacent to the inoperative signal path is selected in response to the generated error. At the same time, all of the signal paths located on a selected side of the inoperative signal path are shifted also. For example, if a default left configuration is employed, then all signals to the left of the inoperative path are successively shifted to the next signal path to the left. If a default right configuration is used, then all signals to the right of the inoperative path are successively shifted to the next signal path to the right. Accordingly, when an inoperable signal path is detected, the data signal is routed away from the inoperable path and onto the transmission path adjacent to the inoperable path. In the various embodiments, the reconfiguration may default to the transmission path to the left of the inoperable signal path, or the reconfiguration may default to the signal path to the right of the inoperable signal path. In still other of the various embodiments, the transmission system 10 may select a signal path to the left or to the right of the inoperable signal path. Alternative paths above and below the inoperable path may be used as well. That is, the absolute physical location of the selected alternate path can be just about anywhere in space relative to the location of the inoperable path in most embodiments, as long as the alternate path is an operable one. If multiple alternate, operable paths exist, then the alternate, operable path having better signal transmission characteristics than the other existing alternate, operable paths (e.g., shorter length, better resonance, or higher density, etc.) may be selected. As earlier discussed, the various embodiments may also address situations where two of the data lines L<0> through L<7> are defective. Signals may be steered simultaneously to both the left and to the right, so that the signals may be directed towards the nearest one of the redundant lines (e.g., LR and RR).

At block 62, the signal may be transferred along the alternate signal path while shifting all signals to the left or to the right of the inoperative signal path. At block 64, the system may be directed to transfer all of the shifted signals to the originally intended signal paths. For example, if the D<0> signal is shifted to the LR signal path due to an inoperable L<0> path (FIG. 1), the transmission system is reconfigured to redirect the D<0> data signal back to the intended path. In addition, the signals that were shifted to the left or to the right of the inoperative signal path may be restored to the previously intended signal paths.

Figure 5:
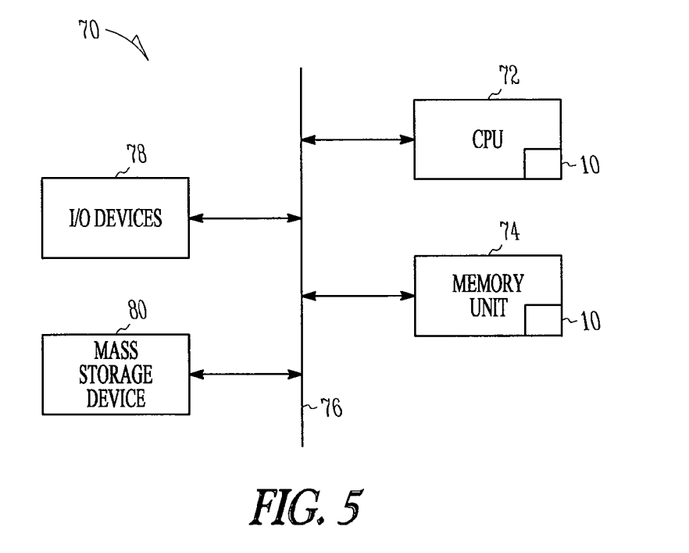
FIG. 5 is a diagrammatic block view of a processing system, according to various embodiments.

FIG. 5 is a diagrammatic block view of a processing system 70 according to various embodiments. The processing system 70 may include a central processing unit (CPU) 72, which may include any digital device capable of receiving data and programmed instructions, and processing the data according to the programmed instructions. Accordingly, the CPU 72 may include a microprocessor, such as a general purpose single-chip, or a multi-chip microprocessor. In particular, the multi-chip microprocessor may be structured as a three-dimensional multi-chip package, such as a system in package (SiP), or a chip stack multi-chip module (MCM) the chipstack multi-chip module, and may include one or more of the redundant signal transmission systems, according to one or more of the embodiments, such as, for example, the redundant signal transmission system 10 of FIG. 1. The CPU 72 is generally configured to communicate with a memory unit 74 over a suitable communications bus 76. The memory unit 74 may also be structured as a three-dimensional multi-chip package, and may include one or more of the redundant signal transmission systems, according to one or more of the embodiments. The processing system 70 may also include various other devices that are operably coupled to the bus 76, which are configured to cooperatively interact with the CPU 72 and the memory unit 74. For example, the processing system 70 may include one or more input/output (I/O) devices 78, such as a printer, a display device, a keyboard, a mouse, or other known input/output devices. The processing system 70 may also include a mass storage device 80, which may include a hard disk drive, a floppy disk drive, an optical disk device (CD-ROM), or other similar devices. It is understood that FIG. 5 provides a simplified representation of the processing system 70. Accordingly, it is understood that other devices not shown in FIG. 5, but known in the art (such as, for example, a memory controller, and other similar devices) may nevertheless be present in the processing system 70. As the various figures have shown, there may be multiple local paths and global paths in a memory system.

The processing system 70 may also form a part of other larger systems, such as a wireless device, which may include devices such as a wireless telephone, a personal digital assistant (PDA), or another of a variety of known wireless devices.

While various embodiments have been illustrated and described, as noted above, changes can be made without departing from the disclosure. The accompanying drawings that form a part hereof show by way of illustration, and not of limitation, various embodiments in which the subject matter may be practiced. The embodiments illustrated are described in sufficient detail to enable those skilled in the art to practice the teachings disclosed herein. Other embodiments may be utilized and derived therefrom. This Detailed Description, therefore, is not to be taken in a limiting sense.

Although specific embodiments have been illustrated and described herein, it should be appreciated that any arrangement calculated to achieve the same purpose may be substituted for the various embodiments shown. Furthermore, although the various embodiments have described redundant signal transmission systems, it is understood that the various embodiments may be employed in a variety of known electronic systems and devices without modification. This disclosure is intended to cover any and all adaptations or variations of various embodiments. Combinations of the above embodiments, and other embodiments not specifically described herein, will be apparent to those skilled in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the meaning of the claims. In addition, in the foregoing Detailed Description, it can be seen that various features may be grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A signal transmission system, comprising:
    a transmission network having signal paths configured to communicate network signals from an input to an output, the signal paths being located between at least two redundant signal paths;
    a first steering network coupled to the input and in communication with the transmission network;
    a second steering network coupled to the output and in communication with the transmission network; and
    at least one steering control network operable to receive error signals corresponding to an inoperable signal path in the transmission network and to generate steering signals that are communicated to the first steering network and the second steering network, wherein the first steering network is configured to shift the network signals from the inoperable signal path to an alternate, operable signal path, wherein the second steering network is configured to shift the network signals back to intended data paths leading to the output, and wherein, when at least two of the signal paths are determined to be inoperable, the network signals are steered simultaneously in opposite directions towards the at least two redundant signal paths.

2. The signal transmission system of claim 1, comprising a driver network coupled to the first steering network and the transmission network and configured to drive the network signals onto the transmission network, and a receiver network coupled to the second steering network and the transmission network and configured to receive the network signals communicated on the transmission network.

3. The signal transmission system of claim 1, wherein the alternate, operable signal path comprises an adjacent signal path.

4. The signal transmission system of claim 3, wherein the first steering network includes a first driver logic unit coupled to a first redundant signal path, and a second driver logic unit coupled to a second redundant signal path.

5. The signal transmission system of claim 4, wherein the first steering network includes an intermediate driver logic unit coupled to signal paths positioned between the first redundant signal path and the second redundant signal path.

6. The signal transmission system of claim 1, wherein the alternate, operable signal path comprises an immediately adjacent signal path.

7. The signal transmission system of claim 6, wherein the second steering network includes a first receiver logic unit coupled to a first redundant signal path, and a second receiver logic unit coupled to a second redundant signal path.

8. The signal transmission system of claim 7, wherein the second steering network includes an intermediate receiver logic unit coupled to signal paths positioned between the first redundant signal path and the second redundant signal path.

9. A signal transmission system, comprising:
    a plurality of signal paths in communication with an input and configured to communicate network signals to an output, and located between a first redundant signal path and a second redundant signal path;
    a driver steering network coupled to the input and in communication with the plurality of signal paths, wherein the driver steering network is operable to shift the network signals from a first signal path to a second signal path when the first signal path is inoperable; and
    a receiver steering network coupled to the output and in communication with the plurality of signal paths, wherein the receiver steering network is operable to shift the network signals from the second signal path back to the first signal path leading to the output, and wherein, when at least two of the signal paths are determined to be inoperable, the network signals are steered simultaneously in opposite directions towards the first redundant signal path and second redundant signal path.

10. The signal transmission system of claim 9, wherein the driver steering network and the receiver steering network are configured to receive steering control signals generated by at least one steering control network.

11. The signal transmission system of claim 10, wherein the at least one steering control network is responsive to an error input, and is configured to generate the steering control signals to shift the network signals.

12. The signal transmission system of claim 10, wherein the at least one steering control network includes a multiplexing unit.

13. The signal transmission system of claim 9, wherein the plurality of signal paths includes a plurality of conductive vias that extend between a driver network coupled to the driver steering network, and a receiver network coupled to the receiver steering network.

14. A method, comprising:
    determining that a first signal path in a signal transmission system including a driver steering network and a receiver steering network is inoperable;
    generating an error corresponding to the first signal path;
    directing, by the driver steering network, the system to select an alternate signal path in response to the generated error;
    transferring a signal from the first signal path to the alternate signal path; and
    directing, by the receiver steering network, the system to transfer the signal back to the first signal path after the transfer along the alternate signal path, wherein, when the first signal path and a second signal path located between a first redundant signal path and a second redundant signal path are determined to be inoperable, signals from the first signal path and the second signal path are steered simultaneously in opposite directions towards the first redundant signal path and the second redundant signal path.

15. The method of claim 14, wherein determining that a first signal path in a signal transmission system is inoperable includes performing an electrical continuity test to determine if a transmission element is interrupted.

16. The method of claim 14, wherein determining that a first signal path in a signal transmission system is inoperable includes determining if a selected number of resend requests along the first signal path is exceeded.

17. The method of claim 14, wherein directing the system to select an alternate signal path includes selecting a redundant signal path to the first signal path.

18. The method of claim 14, wherein determining that a first signal path in a signal transmission system is inoperable includes dynamically determining that the first signal path is inoperable.

19. The method of claim 14, wherein directing the system to select an alternate signal path includes permanently selecting the alternate signal path.

20. A processing system, comprising:
a processing unit;
a memory unit operably coupled to the processing unit by a communications bus, wherein at least one of the memory unit or the processing unit is structured as a three-dimensional multi-chip package, further comprising:
a plurality of signal paths, in communication with an input and configured to communicate network signals to an output;
a driver steering network coupled to the input and in communication with the plurality of signal paths, wherein the driver steering network is operable to shift the network signals from a first signal path to a second signal path when the first signal path is determined to be inoperable; and
a receiver steering network coupled to the output and in communication with the plurality of signal paths, wherein the receiver steering network is operable to shift the network signals from the second signal path back to the first signal path leading to the output, wherein, when the first signal path and a second signal path, located between a first redundant signal path and a second redundant signal path, are determined to be inoperable, signals from the first signal path and the second signal path are steered simultaneously in opposite directions towards the first redundant signal path and the second redundant signal path.

21. The processing system of claim 20, wherein the plurality of signal paths includes a plurality of through vias extending through at least a portion of the three-dimensional multi-chip package.

22. The processing system of claim 20, wherein the driver steering network and the receiver steering network are configured to receive steering signals generated by at least one steering control network.

23. The processing system of claim 20, wherein the at least one steering control network is responsive to an error input, and generates steering control signals configured to shift the network signals.

24. The processing system of claim 20, wherein the three-dimensional multi-chip package includes one of a system-in-package (SiP) or a chip stack multi-chip module (MCM).

* * * * *

UNITED STATES PATENT AND TRADEMARK OFFICE
CERTIFICATE OF CORRECTION

PATENT NO.        : 8,570,860 B2
APPLICATION NO.   : 12/327648
DATED             : October 29, 2013
INVENTOR(S)       : Ebrahim H. Hargan

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1240 days.

Signed and Sealed this
Twenty-third Day of May, 2017

Michelle K. Lee
*Director of the United States Patent and Trademark Office*